United States Patent [19]

Podhrasky

[11] 4,398,104
[45] Aug. 9, 1983

[54] LOW DRIFT TUNING CIRCUIT
[75] Inventor: Robert J. Podhrasky, Dallas, Tex.
[73] Assignee: Garrett Electronics, Garland, Tex.
[21] Appl. No.: 192,487
[22] Filed: Sep. 30, 1980
[51] Int. Cl.³ .......................... H03K 5/22; G06G 7/18
[52] U.S. Cl. .................................... 307/490; 307/491; 307/494; 328/127
[58] Field of Search .............. 307/490, 494, 491, 352; 328/127-128, 151; 330/9, 258, 259, 260

[56] References Cited
U.S. PATENT DOCUMENTS

| | | | |
|---|---|---|---|
| 3,715,487 | 2/1973 | Blake | 307/494 |
| 3,836,861 | 9/1974 | Diamond | 330/9 |
| 3,988,689 | 10/1976 | Ochi et al. | 330/9 |
| 3,991,323 | 11/1976 | Przybylski | 307/494 |

OTHER PUBLICATIONS
RCA Linear Integrated Circuits Catalog SSD-240A, pp. 244-255 (1978).

Primary Examiner—Stanley D. Miller
Assistant Examiner—B. P. Daus
Attorney, Agent, or Firm—Richards, Harris & Medlock

[57] ABSTRACT

A low drift rate tuning circuit (10) is operated in conjunction with a feedback network (36). An operational amplifier (12) is connected to first and second power supply buses (18, 20). The negative input terminal (16) of the amplifier is connected to the lower voltage supply bus (20). The output of the amplifier (12) is connected to an inverting amplifier (51). The output from the circuit (10) is connected as the input of the feedback network (36) and the input to the circuit (10) is connected to the output of the feedback network (36). In the seek mode the circuit (10) balances the voltages at the input terminals of the operational amplifier (12). In the balance condition the common mode input voltage to the operational amplifier (12) is essentially zero at which voltage the input leakage current is at a minimum. With the leakage current reduced to a minimum the circuit is made more stable by reason of reduced drift over time.

9 Claims, 3 Drawing Figures

LOW DRIFT TUNING CIRCUIT

FIELD OF THE INVENTION

The present invention pertains to operational amplifiers and more particularly to tuning circuits employing such amplifiers.

BACKGROUND OF THE INVENTION

Turning circuits are frequently used in feedback configurations where it is required that a signal from a network be balanced against a reference parameter. Such tuning circuits commonly utilize operational amplifiers as the driving element to balance the circuit. It has heretofore been the usual practice to design an operational amplifier circuit having differential inputs such that the common mode input voltages are at approximately the midpoint between the power supply voltages applied to the operational amplifier. It is a feature of certain operational amplifiers that the leakage current through the amplifier is proportional to the common mode input voltage. In tuning circuit applications which require long term stability, this leakage current can cause the circuit to drift away from its balance condition. One application of this type is in metal detector circuits wherein the circuit is balanced for a given set of operating conditions and then the detector is operated for a period of time under these conditions. If the leakage current through a metal detector tuning circuit used is significant, the circuit will drift out of balance and require frequent retuning.

Therefore, there exists a need for a tuning circuit which reduces the leakage current associated with an operational amplifier to thereby provide a low drift rate and long term stability.

DISCLOSURE OF THE INVENTION

The present invention in one embodiment comprises a low drift tuning circuit powered by first, second and third power buses where the second bus is at a voltage between the voltages of the first and third buses. The circuit is operated in conjunction with a feedback network and includes an operational amplifier having positive, noninverting, and negative, inverting, input terminals, an output terminal and first and second power terminals connected respectively to the first and second power buses. The positive input terminal is coupled to the output of the feedback network and the negative input terminal is coupled to the second power bus. An inverting and level shifting amplifier is provided which has an input terminal and an output terminal. The input terminal of the level shifting amplifier is connected to the output terminal of the operational amplifier and the output terminal of the level shifting amplifier is connected to an input terminal of the feedback network. A capacitor is provided for connection between the positive input terminal of the operational amplifier and the output terminal of the level shifting amplifier for integrating the output signal of the operational amplifier and for storing a charged state when the feedback loop is open.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
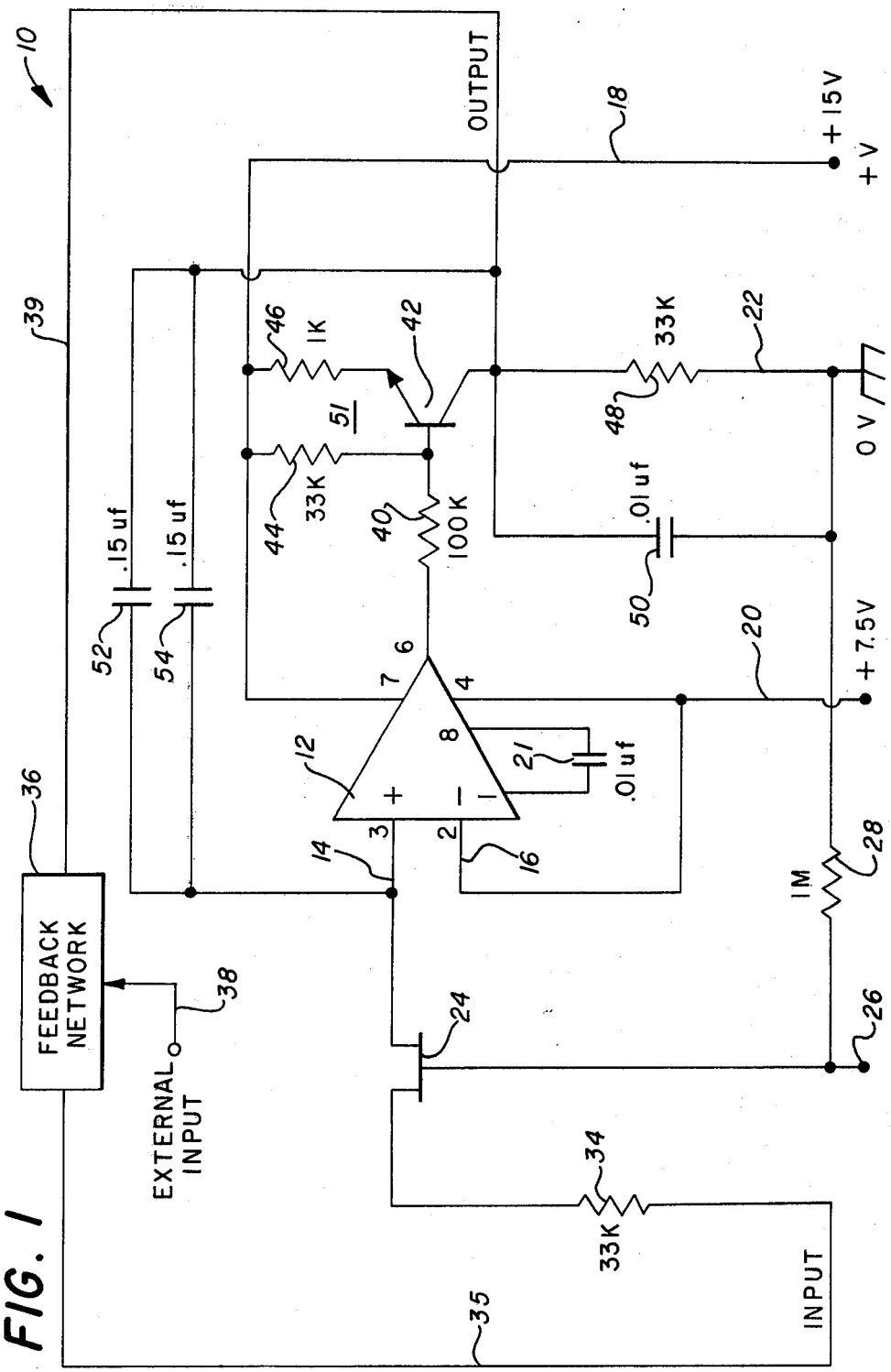
FIG. 1 is a schematic illustration of a low drift tuning circuit which operates in conjunction with a feedback network.

The tuning circuit of the present invention is illustrated as a first embodiment in FIG. 1. The circuit is generally designated by the reference numeral 10. An operational amplifier 12 has a positive, noninverting, input terminal 14, pin 3, and a negative, inverting, input terminal 16, pin 2. The circuit 10 is provided with three power supply buses 18, 20 and 22. For the embodiment illustrated in FIG. 1, bus 18 is provided with +15 volts, bus 20 is provided with +7.5 volts and bus 22 serves as a ground at zero volts. The operational amplifier 12 has the power terminals thereof, pins 7 and 4, connected respectively to the power buses 18 and 20. The negative input terminal 16 of the operational amplifier is connected to the power bus 20. A capacitor 21 is connected between pins 1 and 8 of operational amplifier 12 to provide phase compensation to prevent oscillation.

A field effect transistor 24 has the drain terminal thereof connected to the positive input terminal 14 of operational amplifier 12. The gate terminal of transistor 24 is connected to a control terminal 26 which receives an input signal to turn transistor 24 either on or off. A resistor 28 is connected between the terminal 26 and the ground bus 22. Thus, when a low voltage is applied to terminal 26, the transistor 24 is turned off and is effectively an open circuit. But when terminal 26 receives a high voltage, the transistor 24 will be turned on to serve as a conductor.

The source terminal of the transistor 24 is connected to a first terminal of a resistor 34. The remaining terminal of resistor 34 is connected to an output terminal 35 of a feedback network 36. The network 36 is provided with an external input line 38 which receives an external input signal that can alter the transfer function of the network 36. The transfer function of network 36 is positive rather than inverting. A line 39 provides an input signal to the feedback network 36. The network 36 can comprise either active, passive or both active and passive elements.

The output terminal, pin 6, of operational amplifier 12 is connected through a resistor 40 to the base terminal of a transistor 42. A bias resistor 44 is connected between the power supply bus 18 and the base terminal of transistor 42. An emitter resistor 46 is connected between the power supply bus 18 and the emitter terminal of transistor 42. A collector resistor 48 is connected between the power supply bus 22 and the collector terminal of transistor 42. A capacitor 50 is connected in parallel with resistor 48. The combination of elements 40, 42, 44, 46, 48 and 50 form an inverting amplifier shown generally by the reference numeral 51. The amplifier further serves the purpose of shifting the voltage level and extending the range of the output signal from amplifier 12 for supply to network 36. The output signal from amplifier 12 is limited to the range of 7.5 to 15.0 volts but the signal at the collector of transistor 42 can extend over the range of 0.0 to 15.0 volts.

A pair of capacitors 52 and 54 are connected in parallel between the positive input terminal 14 of operational amplifier 12 and the collector terminal of transistor 42.

The collector terminal of transistor 42 serves as the output of the tuning circuit 10 and is connected to line 39 as an input to the feedback network 36.

In a preferred embodiment of the present invention the operational amplifier 12 is a Model CA3160S which is manufactured by RCA Corporation. The transistor 42 can be a Model 2N3906, a transistor type readily available from a number of manufacturers.

Figure 2:
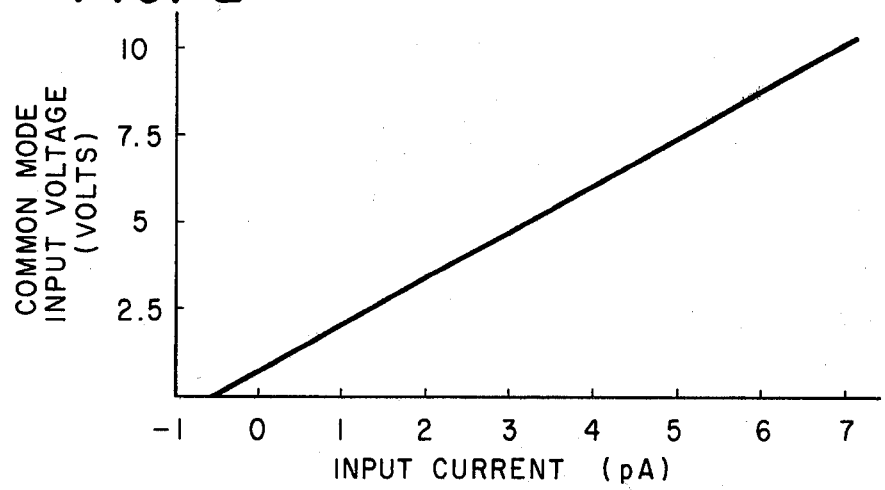
FIG. 2 is a chart illustrating the leakage current of an operational amplifier as a function of the input voltage.

Referring now to FIG. 2 there is illustrated a graph showing the input current for the operational amplifier 12 as a function of the common mode input voltage which is referenced to the lower of the amplifier supply voltages. Note that as the common mode input voltage increases, the input current likewise increases in essentially a linear manner. Thus, from the graph it can be seen that the input current is reduced to a minimum when the common mode input voltage is reduced to be approximately equal to the lower of the supply voltages provided to the operational amplifier 12.

The operation of the circuit of the present invention is now described in reference to FIG. 1. The feedback network 36 is provided with an external input signal through terminal 38. The external input signal can alter the transfer characteristic of the network 36. The output of the feedback network, which is provided to the positive input terminal 14 of operational amplifier 12, is a function of both the input through line 39 to the feedback network 36 and the externally supplied input signal. The output signal through line 35 from the feedback network 36 is selectively connected to the operational amplifier 12 by operation of the switch transistor 24. When the transistor 24 is in the conductive state, the circuit 10 is in the "seek" mode and when the transistor 24 is in the nonconductive state, the circuit 10 is in the "hold" mode.

When the transistor 24 is in the conductive state, the feedback network 36 transmits a DC level signal voltage to the input terminal 14 of operational amplifier 12. If the voltage supplied to terminal 14 is above the fixed voltage supplied to the negative terminal 16, the amplifier 12 drives the output terminal, pin 6, to a more positive state in the range of 7.5 to 15 volts. This more positive signal is transmitted through resistor 40 to the base terminal of transistor 42. As the base terminal of transistor 42 is driven to a more positive condition the transistor 42 is rendered less conductive thereby causing the collector terminal of transistor 42 to be pulled to a lower voltage. The capacitors 52 and 54 serve to integrate the output signal of circuit 10 and are charged and discharged as the output signal changes. The lower voltage at the collector of transistor 42 is transmitted through line 39 to the feedback network 36 where this input causes the output of the network 36 to be driven to a lower voltage state as well. This lower voltage state is in turn transmitted back to the positive input terminal 14 of operational amplifier 12. This operation continues until the voltages at the two input terminals of operational amplifier 2 are at approximately the same level. This is a steady state condition. While the circuit 10 is operating the capacitors 52 and 54, which could be replaced by a single capacitor, are charged to the voltage state represented by the differential between the output of circuit 10 and the input to terminal 14. Thus, when the transistor 24 is rendered nonconductive, the voltage state at terminal 14 is fixed so the output of amplifier 12 remains at the previously determined steady state amplitude. Under these conditions the circuit 10 is in the hold mode.

If the voltage at terminal 14 is lower than the voltage at terminal 16 while transistor 24 is conductive, the output of amplifier 12 will be driven negative thereby driving the base terminal of transistor 42 more negative. When the base of transistor 42 becomes more negative, transistor 42 becomes more conductive and the collector terminal is pulled to a more positive voltage. This more positive output signal from amplifier 51 is transmitted to feedback network 36 which causes the output of network 36 to be more positive. The output signal of network 36 is conveyed through transistor 24 to raise the voltage at terminal 14 until it balances the voltage at terminal 16.

The external input signal transmitted through line 38 to the feedback network 36 can alter the transfer function of network 36. This can change the output signal which is transmitted to operational amplifier 12 thereby causing the amplifier to drive its output to a new state in order to rebalance the circuit.

Note that the common mode input voltage to the terminals 14 and 16 of amplifier 12 is the same as the voltage on the low side supply bus 20. In this embodiment the input terminals 14 and 16 are driven to a common voltage of 7.5 volts. However, the common mode voltage is referenced with regard to the lower supply bus connected to amplifier 12 and therefore the common mode input voltage to amplifier 12 is 0.0 volts. Referring again to FIG. 2 it can be seen that under these conditions the input leakage current is less than 1 picoamp. Had the circuit 10 been operated in the conventional manner with a 7.5 volt common mode input voltage it can be seen from FIG. 2 that the leakage current would be approximately 5 picoamps.

The output voltage drift rate of the circuit 10 is given by the equation:

$$V_{out} = \frac{1}{C_1 + C_3} \times I_{in} \times t \qquad (1)$$

The terms $C_1$ and $C_3$ represent the capacitance of capacitors 52 and 54. The term $I_{in}$ represents the input leakage current of the operational amplifier 12. The term t is time.

From the equation (1) can be seen that the drift of the output voltage is directly proportional to time and to the input leakage current. It is inversely proportional to the capacitance of capacitors 52 and 54.

In the application where the tuning circuit 10 is used in a metal detector circuit, it has been found that the maximum allowable drift rate for the output voltage of the circuit 10 is on the order of 0.1 millivolt per minute. Since the sizes of the capacitors are limited by physical restraints, it can be seen from the equation and from the graph of FIG. 2 that the input leakage current should be on the order of 0.5 picoamps. This requires that the common mode input voltage be no more than one volt. This condition is met with the circuit of the present invention shown in FIG. 1.

Figure 3:
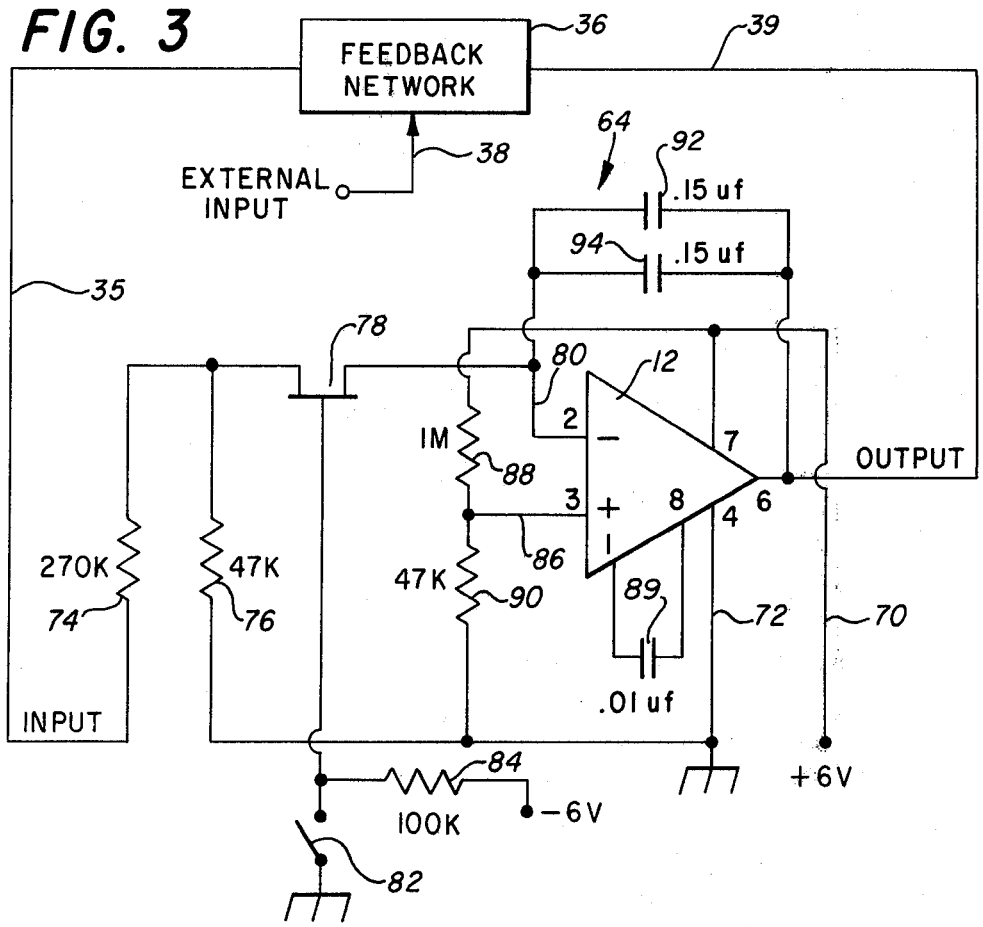
FIG. 3 is a second embodiment of a low drift tuning circuit which operates in conjunction with a feedback network.

A further embodiment of the circuit of the present invention is illustrated in FIG. 3. The feedback network 36 and operational amplifier 12 are the same as illustrated for the circuit in FIG. 1. The low drift tuning circuit is generally represented by the reference numeral 64.

The circuit 64 is provided with two power supply buses 70 and 72 in contrast with the three power supply buses provided for the circuit in FIG. 1. In this embodiment, power supply bus 70 is provided with +6 volts while the supply bus 72 is designated as ground at 0.0 volts.

The output signal conveyed through line 35 from the feedback network 36 is transmitted through a voltage divider network comprising resistors 74 and 76 which are connected serially between line 35 and the ground supply bus 72.

A depletion mode field effect transistor 78 has the source and drain terminals thereof connected between the junction of resistors 74 and 76 and the negative, inverting, input terminal 80, pin 2, of the operational amplifier 12. The gate terminal of transistor 78 is connected to a control switch 82 and through a resistor 84 to a node which is driven to approximately −6 v by circuitry, not shown. Transistor 78 is rendered conductive when switch 82 is closed and is rendered nonconductive when switch 82 is open.

Operational amplifier 12 has a positive, noninverting, input terminal 86, pin 3, which is connected to the junction of voltage divider resistors 88 and 90. The voltage divider resistors 88 and 90 are connected serially between the power supply buses 70 and 72. The impedance of resistor 88 is approximately twenty times that of resistor 90 such that the voltage of the junction mode between the voltage divider resistors is only slightly above the voltage of the ground supply bus 72. For the circuit of the embodiment illustrated in FIG. 3 the fixed input voltage to the positive terminal 86 of amplifier 12 is approximately +0.25 volts.

The positive and negative power terminals, pins 7 and 4, of amplifier 12 are connected respectively to the power supply buses 70 and 72. Amplifier 12 is further provided with a capacitor 89 which functions to phase compensate the amplifier 12 and prevent oscillation. Capacitor 89 is connected to pins 1 and 8 of amplifier 12. The output terminal, pin 6, of amplifier 12 is connected to line 39 to provide an input to the feedback network 36.

Capacitors 92 and 94 are connected in parallel between the negative input terminal 80 of amplifier 12 and the output terminal, pin 6, of amplifier 12.

The operation of the circuit 64 illustrated in FIG. 3 is essentially the same as that described for the circuit 10 in FIG. 2. In circuit 64 the positive input terminal 86 of amplifier 12 is connected to a fixed voltage reference node which is set at a voltage only slightly offset from the ground supply bus 72. This connection arrangement similarly draws the common mode input voltage down to approximately that of the ground supply bus.

The output signal through line 35 from the feedback network 36 is voltage offset by the operation of the voltage divider network comprising resistors 74 and 76. The impedance illustrated for these resistors produces approximately a 6 to 1 voltage division to reduce the amplitude of the signal provided to input terminal 80 of amplifier 12.

The capacitors 92 and 94 are similarly utilized to integrate the amplifier output signal during the seek mode and to fix the input signal for the hold mode.

When the switching transistor 78 is rendered conductive and the feedback network provides a signal to the negative input terminal 80 and the input signal is above the voltage at the positive input terminal 86, the output of amplifier 12 will be driven negative. The negative driven output signal is transmitted to the feedback network 36 which provides a positive, rather than inverting, transfer function and the output of the feedback network likewise is driven negative. This in turn serves to drive the input voltage provided to terminal 80 more negative until it essentially equals the voltage at input terminal 86. When this occurs the circuit 64 is in a balanced condition. Should a differing input signal be applied through line 38 to the feedback network 36, the output of the network 36 will be changed and cause the circuit 64 to readjust to a new balance condition. If the voltage at terminal 80 is less than the voltage at terminal 86, the output of amplifier 12 is driven positive which serves to pull the voltage at terminal 80 positive until it balances the voltage at terminal 86.

Thus, when the circuit 64 is in the balanced condition the common mode voltage will be very near zero thereby reducing the leakage current to approximately 1 picoamp or less. This insures that the circuit 64 will be stable over an extended period of time and have a low drift rate.

In summary, the present invention comprises a low drift rate circuit which is achieved by operating the input terminals to an amplifier at a very low common mode voltage which serves to reduce the amplifier leakage current and thereby reduce the circuit drift.

Although several embodiments of the invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention.

I claim:

1. A low drift circuit powered by first and second power buses and operated in conjunction with a feedback network, the circuit comprising:

an operational amplifier having positive and negative input terminals for receiving input voltages, an output terminal and first and second power supply terminals connected respectively to said first and second power buses, said negative input terminal connected to said second power bus such that when said input voltages at said positive and negative input terminals are balanced by said feedback network to equal the voltage on said second power bus, said operational amplifier has a common mode input voltage of essentially zero volts, means for coupling the output of said feedback circuit to said positive input terminal, an inverting amplifier having an input terminal and an output terminal, the input terminal thereof connected to the output terminal of said operational amplifier and the output terminal of said inverting amplifier coupled to the input of said feedback network, and a capacitor connected between the positive input terminal of said operational amplifier and the output terminal of said inverting amplifier for integrating an output signal from said inverting amplifier.

2. A low drift circuit powered by first, second and third power buses where the second bus is at a voltage between the voltages of the first and third buses, the circuit for use in conjunction with a feedback network, comprising:

an operational amplifier having positive and negative input terminals, an output terminal and first and second power terminals connected respectively to said first and second power buses, said operational amplifier having a common mode input voltage, said positive input terminal connected to the output of said feedback network and said negative input terminal connected to said second power bus for referencing said common mode input voltage to said second power bus to minimize said common mode input voltage, an inverting amplifier having an input terminal and an output terminal, the input terminal thereof connected to the output terminal of said operational amplifier, the output terminal of said inverting amplifier connected to an input terminal of said feedback network, and a capacitor connected between the positive input terminal of said operational amplifier and the output terminal of said inverting amplifier for integrating an output signal from said inverting amplifier.

3. A low drift circuit powered by first and second power supply buses and operated in conjunction with a feedback network, the circuit comprising:

an operational amplifier having positive and negative input terminals, an output terminal, and first and second power terminals connected respectively to said first and second power buses, said operational amplifier having a common mode input voltage, the output terminal of said operational amplifier connected to an input terminal of said feedback network, a first voltage divider circuit connected between an output terminal of said feedback network and the negative input terminal of said operational amplifier for supplying an input signal thereto;

a reference node having a fixed voltage applied thereto, said fixed voltage slightly offset from the voltage on said second power bus to minimize said common mode input voltage, said reference node connected to the positive input terminal of said operational amplifier; and a capacitor connected between the output terminal of said operational amplifier and the negative input terminal thereof for integrating an output signal from said operational amplifier.

4. The circuit recited in claim 3 including a switch transistor connected between said negative input terminal and said voltage divider circuit.

5. A method for reducing the drift of a tuning circuit powered by first, second and third power buses where the second bus is at a voltage between the voltages of the first and third buses, comprising the steps of:

connecting the power terminals of an operational amplifier to said first and second power buses;

connecting a negative, inverting input of said operational amplifier to said second power bus to set the common mode input voltage of said operational amplifier at essentially zero volts referenced to said second power bus, said common mode input voltage being proportional to the input leakage current of said operational amplifier;

transmitting the output signal from said operational amplifier through a level shifting and inverting amplifier;

connecting the output of said inverting amplifier to a feedback network; and connecting the output of said feedback network to the positive, noninverting input of said operational amplifier.

6. The method recited in claim 5 further including the step of integrating the output signal from said operational amplifier by charging a capacitor connected between the positive input terminal of said amplifier and the output terminal thereof.

7. A method for reducing the drift of a tuning circuit powered by first and second power buses which operates with a feedback network, comprising the steps of:

connecting the power terminals of an operational amplifier to said first and second power buses, said operational amplifier having an input leakage current proportional to a common mode input voltage;

coupling the output signal of an operational amplifier to an input of said feedback network;

coupling the output signal of the feedback network to one of the input terminals of said operational amplifier which has a positive, non-inverting input terminal and a negative, inverting input terminal; and connecting the other of the input terminals to a reference voltage node which has a fixed voltage slightly offset from the voltage of said second power bus such that said common mode input voltage at the input terminals of said operational amplifier is approximately zero.

8. The method recited in claim 7 wherein the step of coupling the output signal of an operational amplifier to an input of said feedback network comprises shifting the level and inverting the output signal of said operational amplifier before supplying the operational amplifier output signal to said feedback network.

9. The method recited in claim 7 wherein the step of coupling the output signal of the feedback network to one of the input terminals of said operational amplifier comprises passing the feedback network output signal through a voltage divider network to shift the voltage levels of the feedback network output signal before supplying the feedback network output signal to said one input terminal.

* * * * *

UNITED STATES PATENT AND TRADEMARK OFFICE
CERTIFICATE OF CORRECTION

PATENT NO. : 4,398,104
DATED : August 9, 1983
INVENTOR(S) : Robert J. Podhrasky

It is certified that error appears in the above—identified patent and that said Letters Patent is hereby corrected as shown below:

Column 1, line 10, change "Turning" to --Tuning--.

Column 3, line 61, change "2" to --12--.

Column 5, line 28, change "mode" to --node--.

Column 6, line 24, after "an", insert --operational--.

Signed and Sealed this

Sixth Day of December 1983

[SEAL]

Attest:

GERALD J. MOSSINGHOFF

Attesting Officer     Commissioner of Patents and Trademarks